United States Patent
Yamamura

(10) Patent No.: US 8,723,294 B2
(45) Date of Patent: May 13, 2014

(54) RESISTANCE ELEMENT AND INVERTING BUFFER CIRCUIT

(75) Inventor: Ken Yamamura, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 219 days.

(21) Appl. No.: 13/274,535

(22) Filed: Oct. 17, 2011

(65) Prior Publication Data

US 2012/0097910 A1    Apr. 26, 2012

(30) Foreign Application Priority Data

Oct. 20, 2010   (JP) ................................. 2010-235628

(51) Int. Cl.
*H01L 21/02* (2006.01)

(52) U.S. Cl.
USPC ............. 257/538; 257/60; 257/379; 257/380; 257/540; 257/E27.035

(58) Field of Classification Search
USPC ........... 257/60, 318, 379, 380, 528, 536, 537, 257/538, 540, 542, 543, E27.016, E27.035, 257/E29.326
See application file for complete search history.

(56) References Cited

U.S. PATENT DOCUMENTS

| | | | |
|---|---|---|---|
| 4,604,641 A * | 8/1986 | Konishi | 257/379 |
| 5,600,276 A * | 2/1997 | Imamura et al. | 327/362 |
| 5,903,033 A * | 5/1999 | Suwa | 257/358 |
| 6,369,409 B1 | 4/2002 | Takasu et al. | |
| 6,369,654 B1 * | 4/2002 | Inagaki et al. | 330/293 |
| 6,504,220 B2 * | 1/2003 | Sato | 257/380 |
| 6,734,075 B2 * | 5/2004 | Onodera | 438/382 |
| 2008/0002446 A1 * | 1/2008 | Selgi et al. | 363/147 |
| 2009/0061803 A1 * | 3/2009 | Hadjichristos | 455/234.2 |

FOREIGN PATENT DOCUMENTS

| | | |
|---|---|---|
| GB | 1 517 266 | 7/1978 |
| JP | 52-137988 | 11/1977 |
| JP | 63-104462 | 5/1988 |
| JP | 01-268049 | 10/1989 |
| JP | 02-304964 | 12/1990 |
| JP | 05-048009 | 2/1993 |
| JP | 05-190773 | 7/1993 |
| JP | 7-335828 | 12/1995 |
| JP | 9-321229 | 12/1997 |
| JP | 2003-282725 | 10/2003 |
| JP | 2010-074035 | 4/2010 |

* cited by examiner

*Primary Examiner* — Eduardo A Rodela
(74) *Attorney, Agent, or Firm* — Morgan, Lewis & Bockius LLP

(57) ABSTRACT

It is possible to suppress a change in a resistance value caused by a potential of a semiconductor substrate 10 near a resistance element layer 13, a power line passing on or above the resistance element layer, or a signal line, without generating useless current or a distortion in a signal. A first conductive layer 15 biased by the potential of a first electrode 11 and a second conductive layer 16 biased by the potential of a second electrode 12 cover below the resistance element layer equally. A change in the resistance value caused by a potential difference between the resistance element layer and a neighboring semiconductor substrate 14 is cancelled by the first conductive layer and the second conductive layer covering at least one of above and below the resistance element layer with both ends biased, so the change in the resistance value is suppressed.

10 Claims, 8 Drawing Sheets

RESISTANCE ELEMENT AND INVERTING BUFFER CIRCUIT

TECHNICAL FIELD

The present invention relates to a resistance element and an inverting buffer circuit, in particular, to a resistance element and an inverting buffer circuit, whereby a change in the resistance value caused by a neighboring potential is suppressed.

BACKGROUND ART

In a semiconductor integrated circuit, a desired electronic circuit is composed of a combination of a resistance element, a capacitor, a transistor, and the like. Therefore, it is desirable that the characteristic of each element should not be changed. Taking an example of a resistance element, a change in the resistance value of the resistance element is highly undesirable for the configuration of an electronic circuit. Lots of resistance elements, however, use polysilicon or a diffusion layer as a material. The widening state of the depletion layer is therefore changed by a potential difference between the potential of the resistance element and the potential of a neighboring (upper or lower surface) semiconductor substrate or the like, thereby changing the width of a conductive region.

This changes the resistance value of the resistance element.

In order to suppress such a change in the resistance value caused by the potential of the neighboring semiconductor substrate or the like, Patent Document 1 describes a semiconductor device (resistance element) 100 as shown in FIG. 8.

In this semiconductor device 100, a P-type diffusion region 103 is formed on the main surface of an N-type island region 102 formed in a P-type semiconductor substrate 101. On this surface, there are provided a first electrode 104 for applying a high-potential voltage and a second electrode 105 for applying a low-potential voltage, and in addition, a third electrode 106 for applying a high-potential voltage on the surface of the island region 102 at the outside of the surface of the P-type diffusion region 103 and a fourth electrode 107 for applying a low-potential voltage thereon.

With such a configuration, the semiconductor device 100 is configured such that the electric potential distribution of the island region 102 corresponds to that of the P-type diffusion region 103.

Additionally, Patent Document 2 describes a semiconductor device (resistance element) 200 as shown in FIG. 9.

This semiconductor device 200 includes: an epitaxial layer 202 formed on a semiconductor substrate 201; a buried layer 203 formed in the epitaxial layer 202; a circular element isolation region 204 having an approximately same depth as that of the buried layer 203 and spaced apart from the buried layer 203; and an N+ type layer 205 formed in the circular element isolation region 204 from the surface of the epitaxial layer 202.

On the uppermost surface, a LOCOS oxide film 206, a polysilicon resistance 207, and an interlayer insulation layer 208 are successively provided, and electrodes 210 to 212 are arranged at three places in the interlayer insulation layer 208 on the polysilicon resistance 207. Furthermore, an electrode 213 is formed on the N+ type layer 205. In this situation, the three electrodes 210 to 212 are disposed such that the electrode 212 is located substantially at a center position on the polysilicon resistance 207 to have the same distances from the electrodes 210 and 211, respectively. The electrode 212 and the electrode 213 are connected by a wiring 209 to maintain the same potential.

PRIOR ART DOCUMENTS

Patent Documents

Patent Document 1: JP H05-190773 A
Patent Document 2: JP Patent 4383016 B

SUMMARY OF THE INVENTION

Problem to be Solved

In the above-described semiconductor device of Patent Document 1, however, current also flows into a conductive island region on the lower surface of the diffusion region serving as a resistance element. Hence, there is a problem that the semiconductor device consumes current wastefully.

Besides, in the semiconductor device of Patent Document 2, the electrode 212 and the electrode 213 are connected by the wiring 209 so that they can maintain the same potential, thereby accompanying a useless capacitive load at the center of the polysilicon resistance 207. This causes a distortion of a signal, in some cases.

Therefore, the present invention has been made in consideration of the above problems, and has an object to provide a resistance element and an inverting buffer circuit, which makes it possible to suppress a change in a resistance value caused by a potential of a semiconductor substrate in the neighborhood of the resistance element layer, a power line passing on or above the resistance element layer, or a signal line, without generating useless current or a distortion in a signal.

Solution to the Problem

A resistance element and an inverting buffer circuit according to the present invention are configured as follows, in order to achieve the above object.

According to an aspect of the present invention, there is provided a resistance element comprising: a resistance element layer formed through an insulation layer on a semiconductor substrate; a first electrode conductive to one end of the resistance element layer; a second electrode conductive to the other end of the resistance element layer; and a first conductive layer and a second conductive layer adjacent to each other and spaced apart from each other via the insulation layer below or above the resistance element layer, wherein the first conductive layer is biased by a potential of the first electrode, and the second conductive layer is biased by a potential of the second electrode.

In the above resistance element, the first and second conductive layers cover at least one of below and above the resistance element layer so as not to be affected by the semiconductor substrate in the neighborhood of the resistance element layer, a power line passing on or above the resistance element layer, a potential of a signal line, or the like. It is thus possible for the first and second conductive layers to cancel and suppress a change of the resistance value caused by a potential difference between the potential of the resistance element and the potential of the semiconductor substrate in the neighborhood of the resistance element layer. It is also possible to prevent useless current from being generated in the neighborhood of the resistance element layer and to prevent a useless capacitive load from being placed on the resistance element layer.

According to another aspect of the present invention, there is provided a resistance element comprising: a resistance element layer formed through an insulation layer on a semiconductor substrate; a first electrode conductive to one end of the resistance element layer; a second electrode conductive to the other end of the resistance element layer; and a first conductive layer and a second conductive layer adjacent to each other and spaced apart from each other via the insulation layer below or above the resistance element layer, wherein the first conductive layer is biased by a potential having a prescribed potential difference from a potential of the first electrode, and the second conductive layer is biased by a potential having a prescribed potential difference from a potential of the second electrode.

In the above resistance element, the resistance element layer is not directly connected with the first or second conductive layer. It is thus possible to suppress the capacitive load between both terminals of the resistance element layer to be small.

According to the above resistance element, in a planar view, an area where the first conductive layer and the resistance element layer overlap may be substantially same with an area where the second conductive layer and the resistance element layer overlap.

According to the above resistance element, in a planar view, a resistance value of the resistance element layer in an area where the first conductive layer and the resistance element layer overlap may be substantially same with a resistance value of the resistance element layer in an area where the second conductive layer and the resistance element layer overlap.

In the above resistance element, the first and second conductive layers can cancel and suppress a change in the resistance value caused by the potential difference between the potential of the resistance element layer and that of the semiconductor substrate in the neighborhood of the resistance element layer. It is also possible to prevent useless current from being generated in the neighborhood of the resistance element layer and to prevent a useless capacitive load from being placed on the resistance element layer.

According to the above resistance element, the resistance element layer may be a polysilicon layer.

In the above resistance element, the same material as a conventional one is employed to suppress a change in the resistance value.

According to the above resistance element, the resistance element layer may be a diffusion layer.

In the above resistance element, even if a material having the resistance value easily changed by the voltage in the neighborhood of the resistance element layer is employed, it is possible to suppress a change in the resistance value.

According to the above resistance element, the first and second conductive layers that cover below the resistance element layer each may be a diffusion layer or a polysilicon layer having a different material from the polysilicon layer of the resistance element layer.

In the above resistance element, it is possible to suppress a change in the resistance value by employing a diffusion layer or a polysilicon layer having a different material from the polysilicon layer of the resistance element layer, for covering below the resistance element layer.

According to the above resistance element, the first and second conductive layers that cover below the resistance element layer each may be a polysilicon layer or a diffusion layer having a different material from the diffusion layer of the resistance element layer.

In the above resistance element, it is possible to suppress a change in the resistance value by employing a polysilicon layer or a diffusion layer having a different material from the diffusion layer of the resistance element layer, for covering below the resistance element layer.

According to the above resistance element, the first and second conductive layers that cover above the resistance element layer each may be a diffusion layer or a polysilicon layer having a different material from the polysilicon layer of the resistance element layer.

In the above resistance element, it is possible to suppress a change in the resistance value by employing a diffusion layer or a polysilicon layer having a different material from the polysilicon layer of the resistance element layer, for covering above the resistance element layer.

According to the above resistance element, the first and second conductive layers that cover above the resistance element layer are each a polysilicon layer.

In the above resistance element, it is possible to suppress a change in the resistance value by employing a polysilicon layer, for covering above the resistance element layer.

According to the above resistance element, the first and second conductive layers are each a metal layer.

In the above resistance element, it is possible to suppress a change in the resistance value by employing a metal layer, for covering at least one of above and below the resistance element layer.

According to another aspect of the present invention, there is provided an inverting buffer circuit comprising: an input resistance element; and a feedback resistance element, each of the input resistance element and the feedback resistance element comprising: a resistance element layer formed through an insulation layer on a semiconductor substrate; a first electrode conductive to one end of the resistance element layer; a second electrode conductive to the other end of the resistance element layer; and a first conductive layer and a second conductive layer adjacent to each other and spaced apart from each other via the insulation layer below or above the resistance element layer, wherein the first conductive layer is biased by a potential of the first electrode, and the second conductive layer is biased by a potential of the second electrode.

According to another aspect of the present invention, there is provided an inverting buffer circuit comprising: an input resistance element; and a feedback resistance element, each of the input resistance element and the feedback resistance element comprising: a resistance element layer formed through an insulation layer on a semiconductor substrate; a first electrode conductive to one end of the resistance element layer; a second electrode conductive to the other end of the resistance element layer; and a first conductive layer and a second conductive layer adjacent to each other and spaced apart from each other via the insulation layer below or above the resistance element layer, wherein the first conductive layer is biased by a potential having a prescribed potential difference from a potential of the first electrode, and the second conductive layer is biased by a potential having a prescribed potential difference from a potential of the second electrode.

In the above inverting buffer circuit, the first and second conductive layers cover at least one of below and above the resistance element layer so as not to be affected by the semiconductor substrate in the neighborhood of the resistance element layer, a power line passing on or above the resistance element layer, a potential of a signal line, or the like. It is thus possible for the first and second conductive layers to cancel and suppress a change of the resistance value caused by a potential difference between the potential of the resistance element and the potential of the semiconductor substrate in the neighborhood of the resistance element layer. It is also possible to prevent useless current from being generated in the neighborhood of the resistance element layer and to prevent a useless capacitive load from being placed on the resistance element layer. Moreover, the gains are same in cases where an input signal has a high voltage and a low voltage, whereby a distortion does not occur at an output.

Advantageous Effects of the Invention

According to the present invention, it is possible to suppress a change in a resistance value caused by a potential of a semiconductor substrate in the neighborhood of the resistance element layer, a power line passing on or above the resistance element layer, or a signal line, without generating useless current in the neighborhood of a resistance element layer or placing a useless capacitive load on the resistance element layer. It is therefore possible to reduce a distortion of a signal in an electronic circuit by employing a resistance element according to the present invention, in a case of configuring an electronic circuit such as an inverting buffer circuit or the like for use in an audio device for which less distortion is demanded.

DESCRIPTION OF EMBODIMENTS

Figure 1:
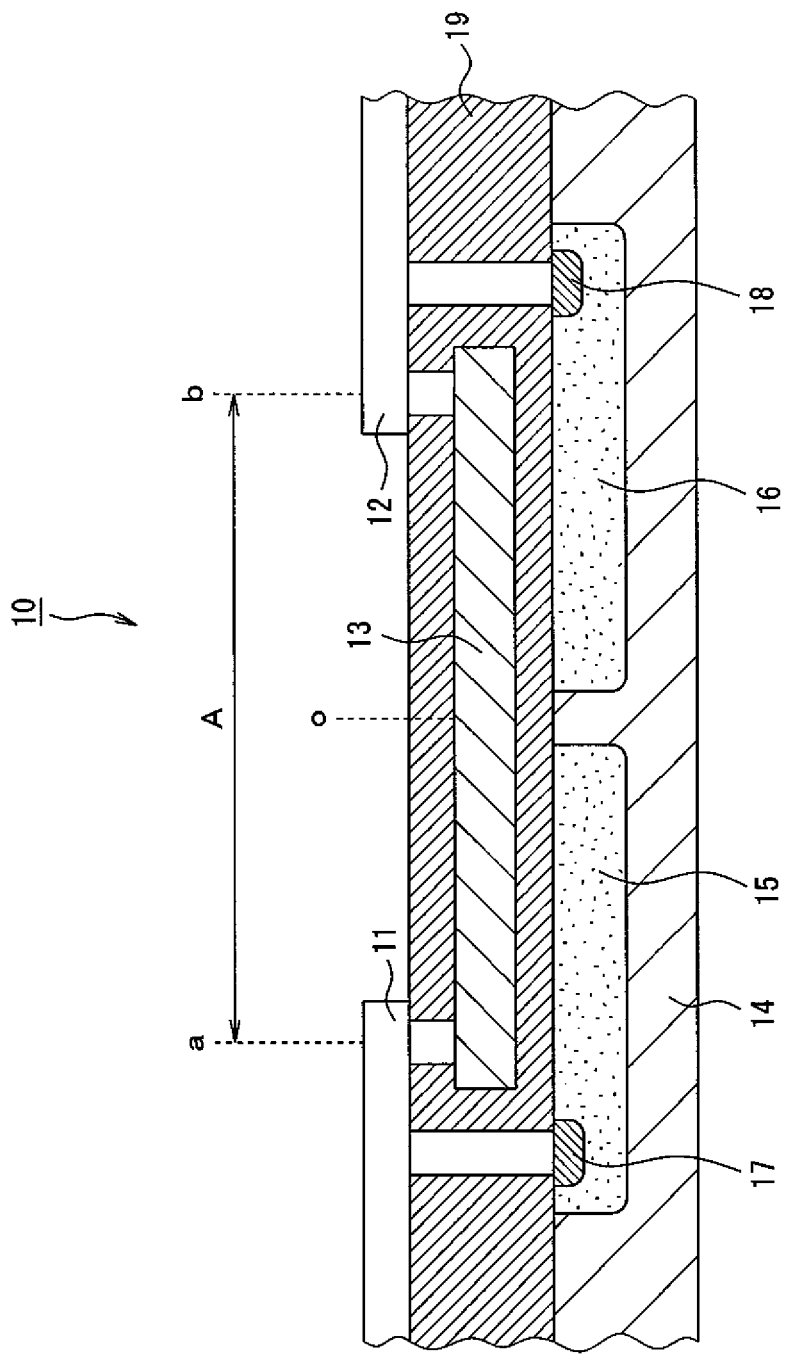
FIG. 1 is a cross-sectional view illustrative of a configuration of a resistance element 10 according to a first embodiment of the present invention.

Hereinafter, a detailed description will be given of embodiments of a resistance element and an inverting buffer circuit according to the present invention, with reference to the accompanying drawings. In the description of the drawings, the same reference numerals are given to the same components, so that the overlapping description will be omitted.

(First Embodiment)

Firstly, referring to FIG. 1 and FIG. 2, a configuration of a resistance element 10 according to a first embodiment will be described. FIG. 1 is a configuration diagram illustrative of a configuration of the resistance element 10 according to the first embodiment of the present invention, and is a cross-sectional view when the resistance element 10 is viewed from the side surface direction.

The resistance element 10 illustrated in FIG. 1 includes: a first electrode 11; a second electrode 12; a resistance element layer 13; a semiconductor substrate 14; a first conductive layer 15; a second conductive layer 16; diffusion layers 17 and 18; and an interlayer insulation layer 19. In the resistance element 10, the resistance element layer 13 made of polysilicon is formed on the P-type semiconductor substrate 14. The interlayer insulation layer 19 made of $SiO_2$ or the like is formed around the resistance element 10. The resistance element layer 13 has the first electrode 11 and the second electrode 12, which are a pair of conductors for flowing current. The first electrode 11 and the second electrode 12 each made of metal of aluminum or the like.

In addition, in the resistance element 10, the first conductive layer 15 biased by the potential of the first electrode 11 and the second conductive layer 16 biased by the potential of the second electrode 12 are arranged below the resistance element layer 13 to substantially equally or equally cover the resistance element layer 13. The first conductive layer 15 and the second conductive layer 16 are each an N-type diffusion later with a low impurity concentration, so-called N-WELL. Furthermore, the first conductive layer 15 and the second conductive layer 16 are adjacent to each other, but are spaced apart from each other. Moreover, a connecting part of the first electrode 11 and the first conductive layer 15, and a connecting part of the second electrode 12 and the second conductive layer 16 are coupled through the N-type diffusion layers 17 and 18, respectively, each having a high impurity concentration called N+.

Figure 2:
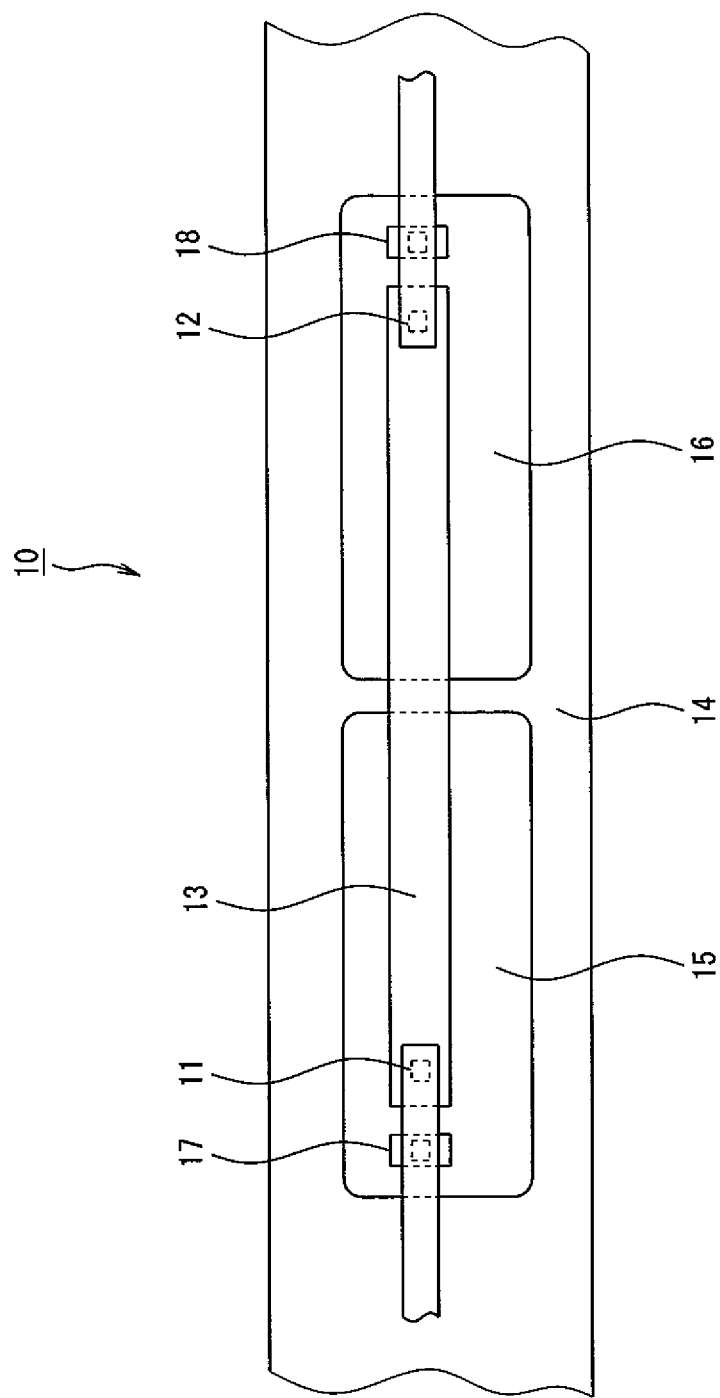
FIG. 2 is a top view illustrative of an arrangement layout example of the resistance element 10 according to the first embodiment of the present invention.

Next, FIG. 2 is a top view illustrative of the resistance element 10 according to the present embodiment when the resistance element 10 is viewed from the upside direction. In FIG. 2, the interlayer insulation layer 19 is omitted for the sake of explanation.

As illustrated in FIG. 2, in the resistance element 10, the first conductive layer 15 and the second conductive layer 16 are arranged to cover below the resistance element layer 13 as illustrated, so that resistance value of the resistance element layer 13 should not be changed by the influence of the semiconductor substrate 14 arranged in the neighborhood of the resistance element layer 13 or the potential of a power line, a signal line, or the like passing on or above the resistance element layer 13.

In the resistance element 10, the first conductive layer 15 and the second conductive layer 16 are arranged to cover below the resistance element layer 13 substantially equally or equally. It is to be noted, however, that the first conductive layer 15 and the second conductive layer 16 are coupled with the first electrode 11 and the second electrode 12, respectively. Thus, there is a part, where the resistance element layer 13 is not covered with a conductive layer, at the boundary between the first conductive layer 15 and the second conductive layer 16. For example, when the resistance element layer 13 is viewed in the lengthwise (lateral) direction, it is preferable that the resistance element layer 13 should be covered substantially equally or equally by 30% or more to less than 50% of the whole area of the resistance element layer 13, respectively.

Then, when the resistance element 10 is used as an electronic circuit, current flows between the first electrode 11 and the second electrode 12 and a voltage is generated. Accordingly, the resistance value of the resistance element 10 is changed by the potential difference between the potential of the resistance element layer 13 and that of the semiconductor substrate 14 arranged in the neighborhood of the resistance element layer 13. How the resistance value of the resistance element 10 is changed will be described below.

It is assumed that a position a is a position where the first electrode 11 and the resistance element layer 13 are in contact with each other, a position b is a position where the second electrode 12 and the resistance element layer 13 are in contact with each other, and a distance A is a distance from the position a to the position b. It is also assumed that R is a resistance value of the resistance element 10, x is a distance from the position a of the resistance element, and r(x) is a resistance value per the unit length at the distance x. Then, as indicated by Expression 1, the resistance value R is obtained by integrating the resistance value r(x) per a unit length with respect to the distance A from the position a to the position b.

$$R = \int_o^A r(x)dx \qquad \text{Expression 1}$$

The resistance element 10 is formed on the semiconductor substrate 14 having a constant voltage. In the resistance value r(x) per a unit length, r0 is a resistance value at the position a and v is a voltage (voltage between electrodes of the resistance element) at the position b with respect to the voltage at the position a. Additionally, the voltage v is added with an element for varying the resistance value at a coefficient k with respect to the potential difference from the neighboring potential. Then, the resistance value r(x) per a unit length is indicated by Expression 2.

$$r(x) = r_0 + k \cdot \frac{x}{A} \cdot v \qquad \text{Expression 2}$$

The substitution of the above Expression 2 results in the resistance value R of Expression 3. The first term on the right side of Expression 3 is a constant value, and does not change. However, the second term on the right side is changed under the influence of the voltage v. It means that the resistance value R of the resistance element 10 is changed by the voltage v between both terminals of the resistance element 10.

$$R = A \cdot r_0 + \frac{1}{2} k \cdot A \cdot v \qquad \text{Expression 3}$$

On the contrary, in the resistance element 10 according to the present embodiment, Expression 4 indicates the resistance value r(x) per a unit length from the position a to the midpoint o of the distance A. At the same time, Expression 5 indicates the resistance value r(x) per a unit length from the midpoint o to the position b.

$$r(x) = r_0 + k \cdot \frac{x}{A} \cdot v \qquad \text{Expression 4}$$

$$r(x) = r_0 + k \cdot \frac{x-A}{A} \cdot v \qquad \text{Expression 5}$$

The substitution of Expressions 4 and 5 into Expression 1 results in the resistance value R as indicated by Expression 6.

$$R = \frac{1}{2}A \cdot r_0 + \frac{1}{8}k \cdot A \cdot v + \frac{1}{2}A \cdot r_0 - \frac{1}{8}k \cdot A \cdot v \qquad \text{Expression 6}$$

Then, the first term and the second term on the right side of Expression 6 are components from the position a to the midpoint o. Additionally, the third term and the fourth term on the right side of Expression 6 are components from the midpoint o to the position b. The second term and the fourth term are cancelled each other in Expression 6, thereby resulting in Expression 7.

$$R = A \cdot r_o \qquad \text{Expression 7}$$

That is, as to the resistance element 10 according to the present embodiment, it means that the resistance value R is not changed by the voltage v between both terminals of the resistance element 10.

Specifically, in the resistance element 10, the first conductive layer 15 and the second conductive layer 16 cover the lower surface of the resistance element layer 13 so that the resistance element layer 13 should not be affected by the potential of the semiconductor substrate 14 in the neighborhood of the resistance element layer 13. It is therefore possible for the first conductive layer 15 and the second conductive layer 16 covering below the resistance element layer 13 to cancel and suppress a change in the resistance value caused by a potential difference between the potential of the resistance element layer 13 and that of the semiconductor substrate 14 or the like arranged in the neighborhood of the resistance element layer 13. Accordingly, the resistance value R of the resistance element 10 is not changed by the potential of the semiconductor substrate 14 or the like arranged in the neighborhood of the resistance element layer 13.

Moreover, neither useless current is generated in the neighborhood of the resistance element layer 13 nor a useless capacitive load is placed on the resistance element layer 13.

(Second Embodiment)

Figure 3:
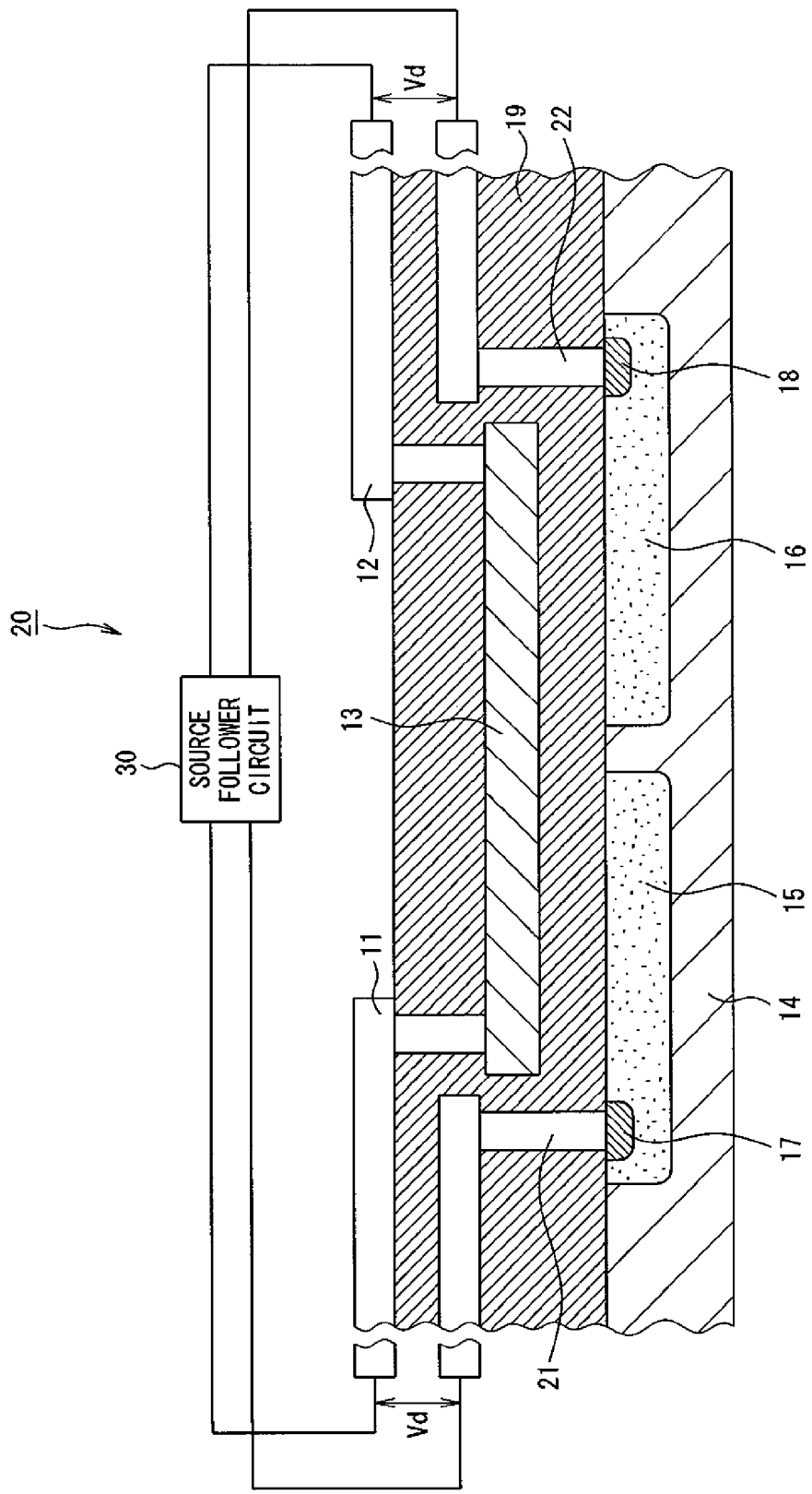
FIG. 3 is a cross-sectional view illustrative of a configuration of a resistance element 20 according to a second embodiment of the present invention.

Subsequently, a configuration of a resistance element 20 according to a second embodiment of the present invention will be described with reference to FIG. 3. FIG. 3 is a cross-sectional view of a configuration diagram illustrative of a configuration of the resistance element 20 according to the second embodiment of the present invention, when the resistance element 20 is viewed from the side surface direction.

The resistance element 20 illustrated in FIG. 3 is provided with the resistance element layer 13, made of polysilicon, having the first electrode 11 and the second electrode 12 arranged above the semiconductor substrate 14, as is the case with the resistance element 10 illustrated in FIG. 1. Then, the first conductive layer 15 and the second conductive layer 16 cover below the resistance element layer 13 substantially equally or equally, in the resistance element 20. However, the resistance element 20 is also provided with a source follower circuit 30 for generating a voltage having a prescribed voltage difference Vd from the potential of the resistance element layer 13. Below the resistance element layer 13 is substantially on halves or on halves covered with the first conductive layer 15 that is biased through a supporting electrode 21 by the prescribed potential difference Vd from the potential of the first electrode 11 and the second conductive layer 16 that is biased through a supporting electrode 22 by the prescribed potential difference Vd from the potential of the second electrode 12.

Subsequently, a description will be given, with reference to FIG. 4, of a circuit configuration of the source follower circuit 30 for generating the voltage having the prescribed potential difference Vd from the potential of the resistance element layer 13.

Figure 4:
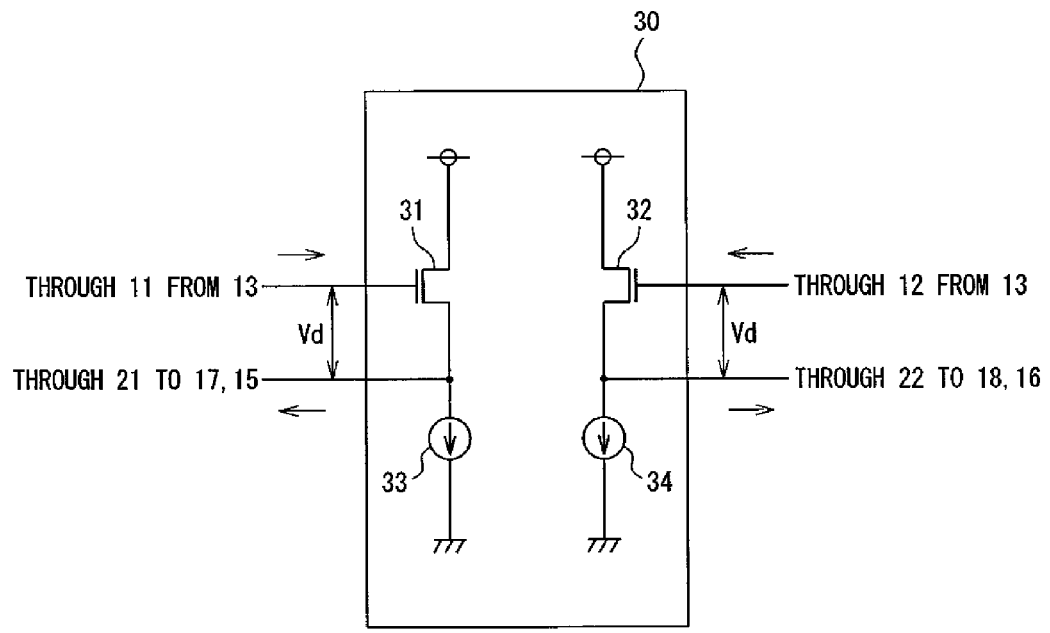
FIG. 4 is a circuit diagram illustrative of a source follower circuit 30 included in the resistance element 20 according to the second embodiment of the present invention.

The source follower circuit 30 illustrated in FIG. 4 is provided with: transistors 31 and 32 each being an NMOS; and constant current sources 33 and 34 each for outputting constant current. The first electrode 11 is connected to the gate of the transistor 31, and the second electrode 12 is connected to the gate of the transistor 32. The first conductive layer 15 is connected to a node between the transistor 31 and the constant current source 33, and the second conductive layer 16 is connected to a node between the transistor 32 and the constant current source 34.

The resistance element 20 according to the second embodiment is configured so that the resistance value R should not be changed by the voltage v between both terminals of the resistance element 20, as in the case with the resistance element 10 according to the first embodiment as described above. Additionally, the resistance element layer 13 is not directly connected to the diffusion layer 17 or 18, in the resistance element 20. Therefore, the resistance element 20 has an advantage of making the capacitive load in the resistance element 10 smaller than that in the resistance element 10 according to the first embodiment.

(Third Embodiment)

Next, a description will be given, with reference to FIG. 5, of a general inverting buffer circuit 40 configured with resistance elements R1 and R2 each having the same configuration with the resistance element 10 or the resistance element 20 according to the present embodiment.

Figure 5:
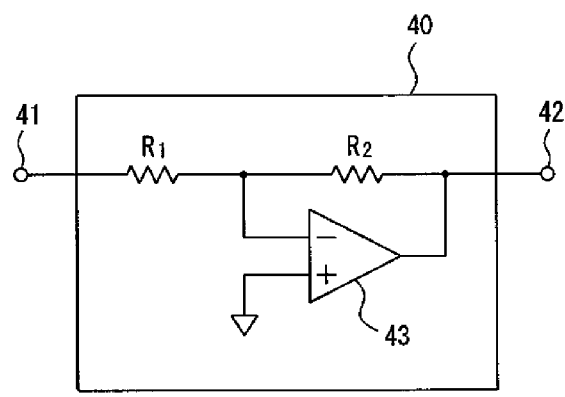
FIG. 5 is a circuit diagram illustrative of a circuit configuration of an inverting buffer circuit 40 including the resistance element according to a third embodiment of the present invention.

In the inverting buffer circuit 40 illustrated in FIG. 5, the resistance elements R1 and R2, each having the same configuration with that of the resistance element according to the present embodiment, are connected between an input terminal 41 and an output terminal 42. The resistance elements R1 and R2 each may employ a resistance element having the same configuration with the resistance element 10, or may employ a resistance element having the same configuration with the resistance element 20.

The inverting input terminal of an operational amplifier 43 is connected to a node between the resistance element R1 and the resistance element R2. The output terminal of the operational amplifier 43 is connected to a node between the resistance element R2 and the output terminal 42. The connection of the resistance element R2 between the input and output of the operational amplifier 43 allows signals output from the output terminal 42 to be fed back. Such an inverting buffer circuit 40 is connected between, for example, an analog sensor and an A/D converter so as to adjust the amplitude of an input signal at the time of A/D conversion.

While R2/R1 indicates the gain of input/output in the inverting buffer circuit 40, the resistance values of the resistance elements R1 and R2 are changed in accordance with the potential of a neighboring semiconductor substrate or the like. The gains are different depending on the case where an input signal has a high voltage or a low voltage, thereby generating a distortion of an output signal. The inverting buffer circuit 40, however, is configured with the resistance elements R1 and R2, each having the same configuration as the resistance element 10 or the resistance element 20. Therefore, the resistance values of the resistance elements R1 and R2 are not changed due to the potential of the neighboring semiconductor substrate or the like. Accordingly, the gains are the same in cases where the input signal has a high voltage and a low voltage, whereby a distortion does not occur at the output.

(Modifications to the Embodiments)

Specifically, the resistance element according to the present embodiment as described above is configured so that the resistance value thereof should not be changed. It is thus possible to employ a material having a resistance value that is easily changed by the neighboring voltage. For example, not only polysilicon but also a diffusion layer can be employed. In addition, in a case where a power line, a signal line, or the like is arranged on or above the resistance element layer 13, a conductive layer can cover above the resistance element layer 13 instead of covering below the resistance element layer 13. Furthermore, conductive layer can cover the both of above and below the resistance element layer 13. Moreover, a diffusion layer, a polysilicon layer, a metal layer, a resistance element layer, or a diffusion layer or polysilicon layer each having a material different from the resistance element layer 13 can be used for the conductive layer covering below the resistance element layer 13. Additionally, a polysilicon layer, a metal layer, or the like can be used for the conductive layer covering above of the resistance element layer 13.

Figure 6:
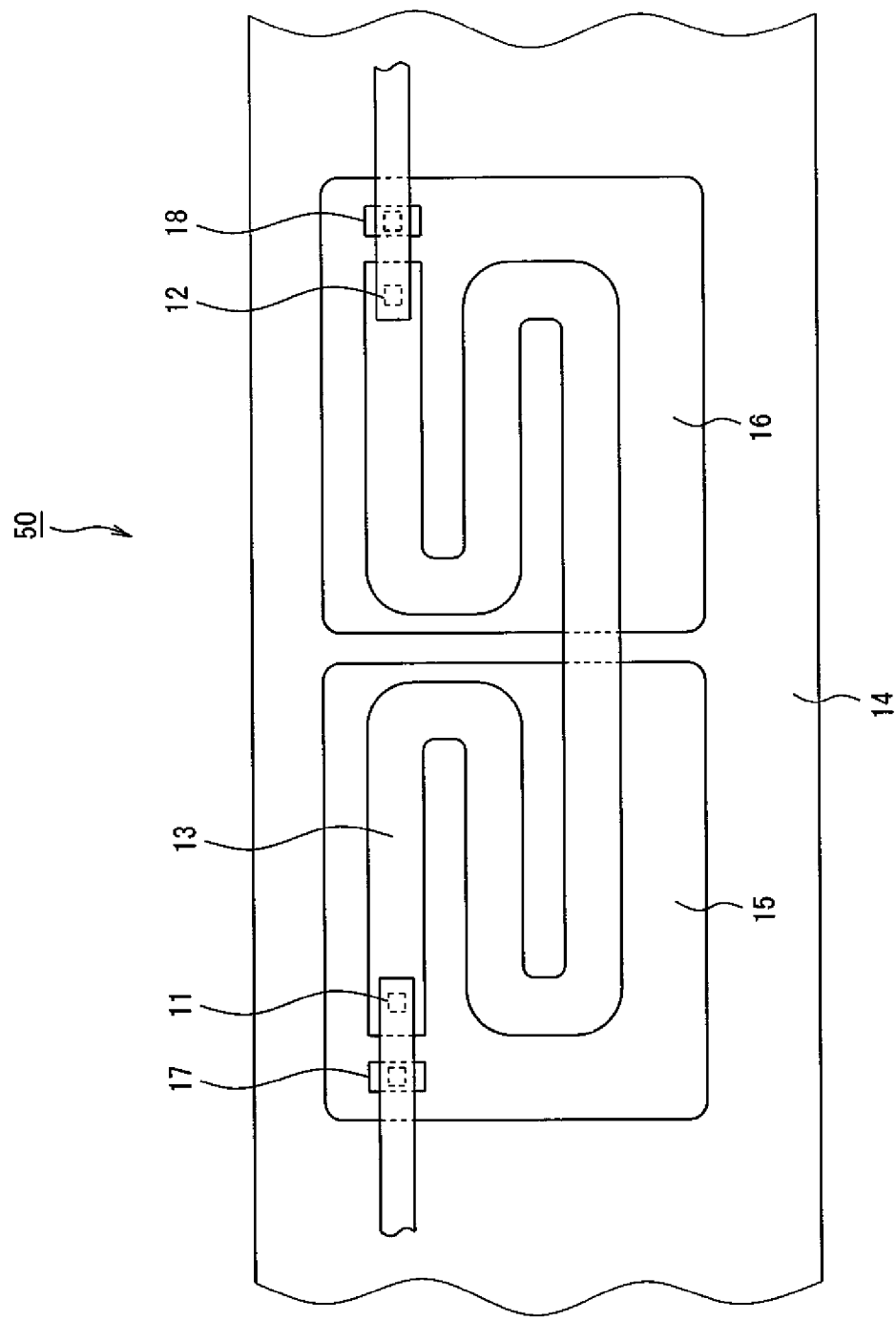
FIG. 6 is a top view illustrative of an arrangement layout example of a resistance element 50 according to a modification of the present invention.
Figure 7:
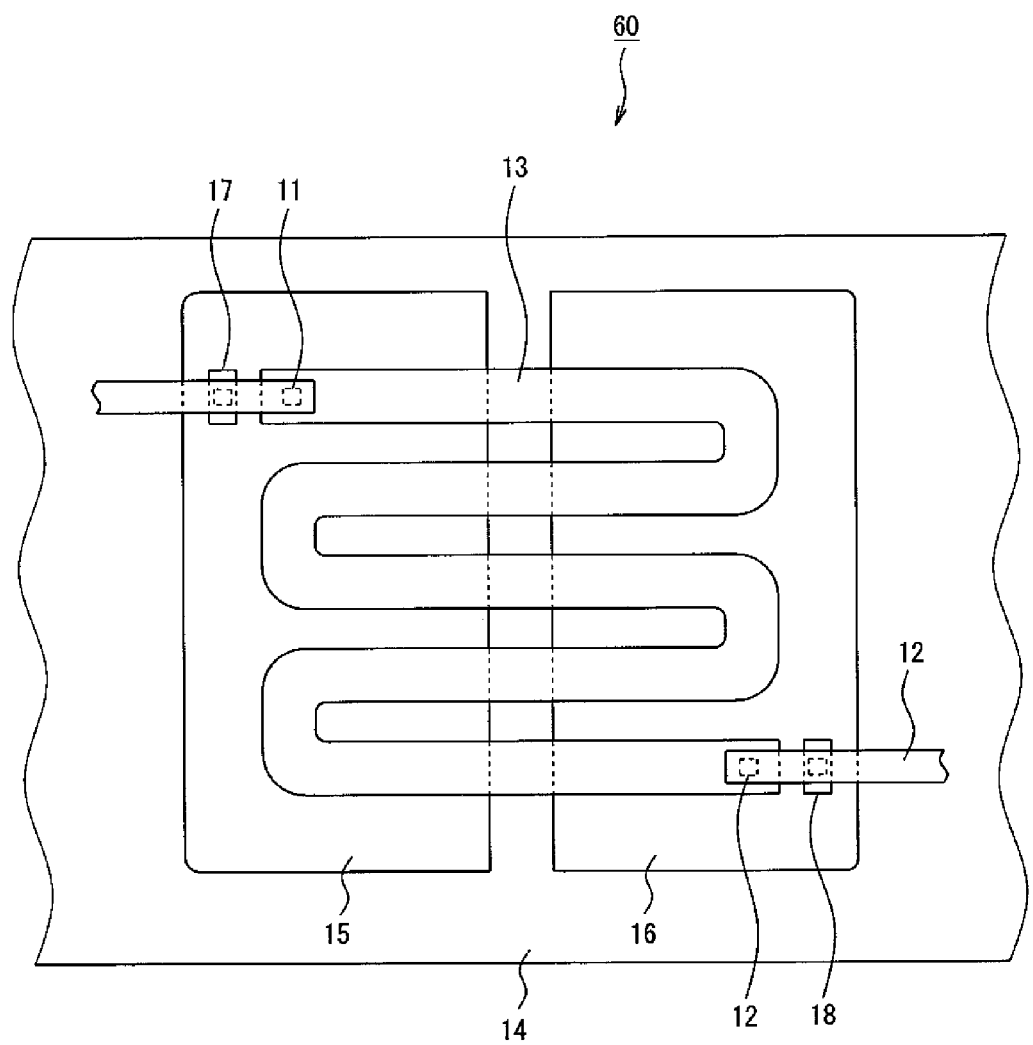
FIG. 7 is a top view illustrative of an arrangement layout example of a resistance element 60 according to a modification of the present invention.
Figure 8:
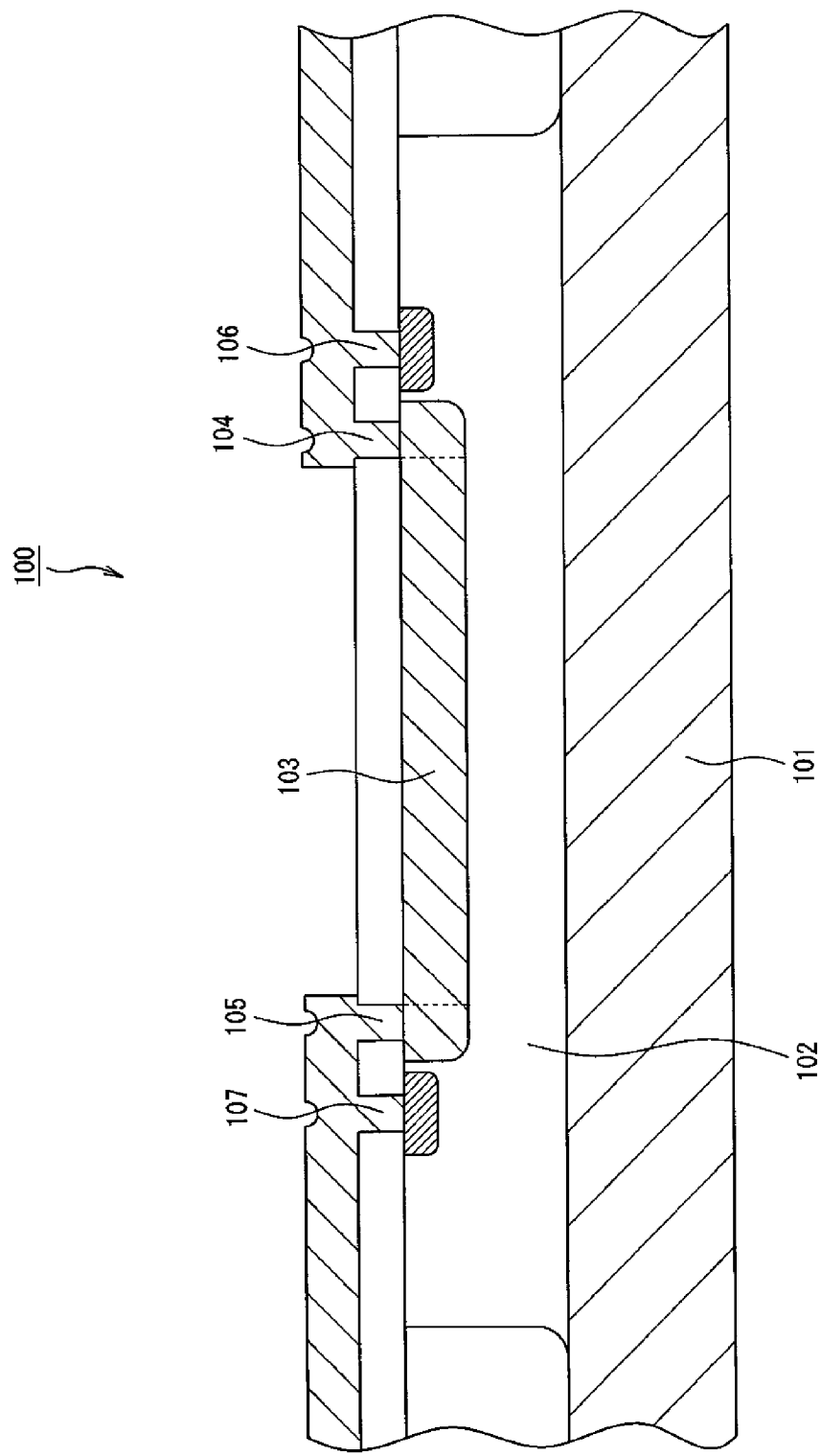
FIG. 8 is a cross-sectional view illustrative of a configuration of a conventional semiconductor device 100.
Figure 9:
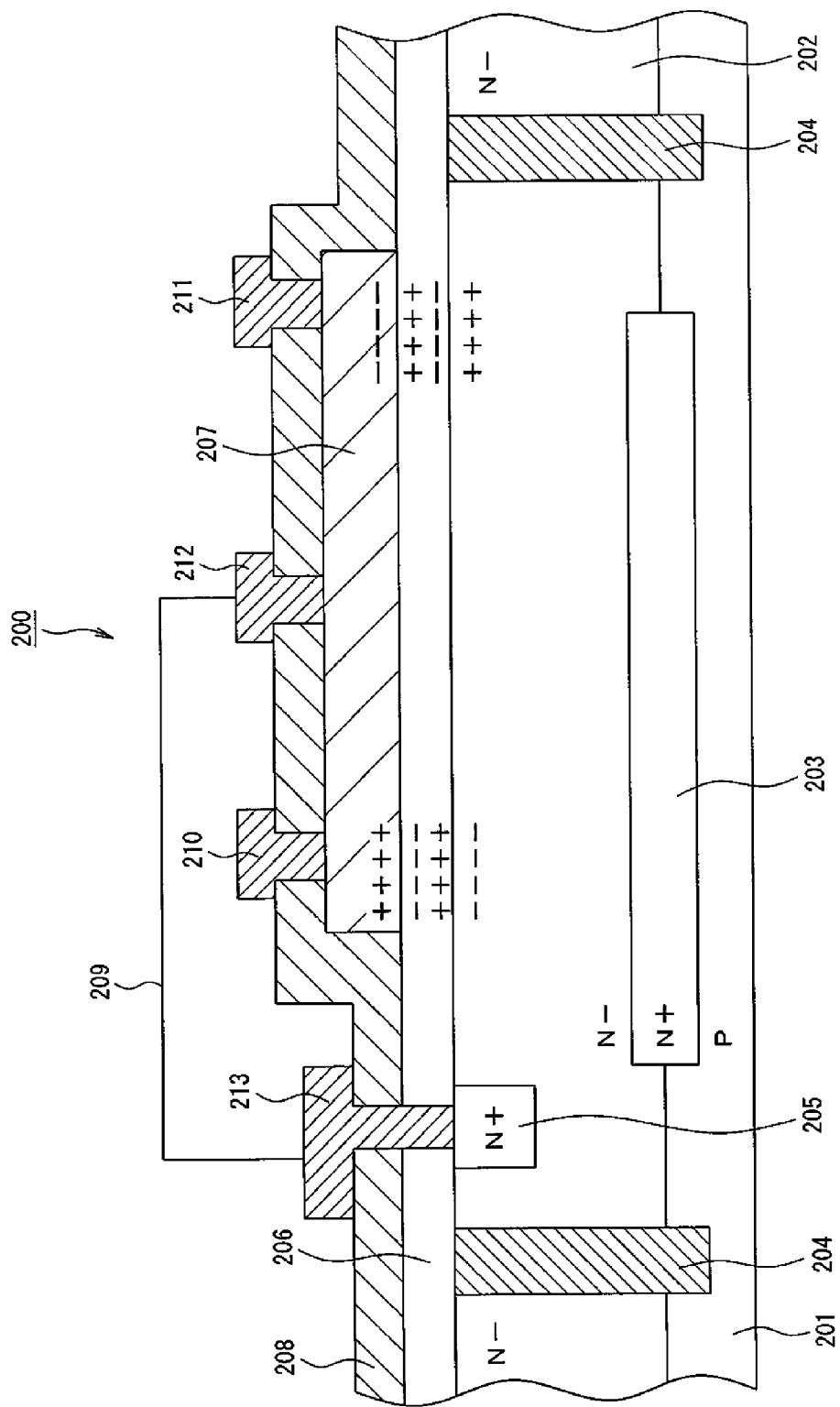
FIG. 9 is a cross-sectional view illustrative of a configuration of a conventional semiconductor device 200.

Furthermore, also in a case where the resistance element layer 13 is covered with the first conductive layer 15 and the second conductive layer 16, the resistance element layer 13 can be covered with various patterns. Examples are illustrated as a resistance element 50 in FIG. 6 and a resistance element 60 in FIG. 7 such that the first conductive layer 15 and the second conductive layer 16 can cover below the resistance element layer 13 substantially equally or equally. In FIG. 6 and FIG. 7, however, the interlayer insulation layer 19 is omitted for the sake of explanation. If the first conductive layer 15 and the second conductive layer 16 covering below the resistance element layer 13 are capable of cancelling a change in the resistance value caused by a potential difference from the semiconductor substrate 14 or the like arranged in the neighborhood of the resistance element layer 13, although they cover in a different manner from that illustrated in FIG. 2, it is possible to obtain a characteristic that the resistance value is not changed by the potential of the semiconductor substrate 14 or the like arranged in the neighborhood of the resistance element layer 13.

Industrial Availability

As a resistance element having a resistance value, a change of which is suppressed, it is possible to use for an electronic circuit such as an inverting buffer circuit or the like of an audio device to which little distortion is demanded.

| Reference Signs List | |
|---|---|
| 10, 20, 50, 60 | resistance element |
| 11 | first electrode |
| 12 | second electrode |
| 13 | resistance element layer |
| 14 | semiconductor substrate |
| 15 | first conductive layer |
| 16 | second conductive layer |
| 17, 18 | diffusion layer |
| 19 | interlayer insulation layer |
| 30 | source follower circuit |
| 40 | inverting buffer circuit |

The invention claimed is:

1. A resistance element comprising:
a resistance element layer embedded within an insulation layer on a semiconductor substrate;
a first electrode connected to one end of the resistance element layer;
a second electrode connected to the other end of the resistance element layer; and
a first conductive layer and a second conductive layer adjacent to each other and spaced apart from each other and electrically non-conductive to each other via the insulation layer below or above the resistance element layer,
wherein the first conductive layer is biased by a potential of the first electrode, and the second conductive layer is biased by a potential of the second electrode.

2. A resistance element comprising:
a resistance element layer embedded within an insulation layer on a semiconductor substrate;
a first electrode connected to one end of the resistance element layer;
a second electrode connected to the other end of the resistance element layer; and
a first conductive layer and a second conductive layer adjacent to each other and spaced apart from each other and electrically non-conductive to each other via the insulation layer below or above the resistance element layer,
wherein the first conductive layer is biased by a potential having a prescribed potential difference from a potential of the first electrode, and the second conductive layer is biased by a potential having a prescribed potential difference from a potential of the second electrode.

3. The resistance element according to claim 1 or claim 2, wherein in a planar view, an area where the first conductive layer and the resistance element layer overlap is substantially same with an area where the second conductive layer and the resistance element layer overlap.

4. The resistance element according to claim 1 or claim 2, wherein in a planar view, a resistance value of the resistance element layer in an area where the first conductive layer and the resistance element layer overlap is substantially same with a resistance value of the resistance element layer in an area where the second conductive layer and the resistance element layer overlap.

5. The resistance element according to claim 1 or claim 2, wherein the resistance element layer is a polysilicon layer.

6. The resistance element according to claim 5, wherein the first and second conductive layers that cover below the resistance element layer are a diffusion layer or a polysilicon layer having a different material from the polysilicon layer of the resistance element layer.

7. The resistance element according to claim 5, wherein the first and second conductive layers that cover above the resistance element layer are each a diffusion layer or a polysilicon layer having a different material from the polysilicon layer of the resistance element layer.

8. The resistance element according to claim 1 or claim 2, wherein the first and second conductive layers are each a metal layer.

9. An inverting buffer circuit comprising:
an input resistance element;
a feedback resistance element; and
an amplifier,
the input resistance element comprising:
a first resistance element layer embedded within an insulation layer on a semiconductor substrate;
a first electrode connected to one end of the first resistance element layer;
a second electrode connected to the other end of the first resistance element layer; and
a first conductive layer and a second conductive layer adjacent to each other and spaced apart from each other and electrically non-conductive to each other via the insulation layer below or above the first resistance element layer,
wherein the first conductive layer is biased by a potential of the first electrode, and the second conductive layer is biased by a potential of the second electrode,
the feedback resistance element comprising:
a second resistance element layer embedded within the insulation layer on the semiconductor substrate;
a third electrode connected to one end of the second resistance element layer;
a fourth electrode connected to the other end of the second resistance element layer; and
a third conductive layer and a fourth conductive layer adjacent to each other and spaced apart from each other via the insulation layer below or above the second resistance element layer,
wherein the third conductive layer is biased by a potential of the third electrode, and the fourth conductive layer is biased by a potential of the fourth electrode,
the amplifier comprising:
a non-inverting input terminal;
an inverting input terminal connected to the second electrode and the third electrode; and
an output input terminal connected to the fourth electrode.

10. An inverting buffer circuit comprising:
an input resistance element;
a feedback resistance element; and
an amplifier,
the input resistance element comprising:
a first resistance element layer embedded within an insulation layer on a semiconductor substrate;
a first electrode connected to one end of the first resistance element layer;
a second electrode connected to the other end of the first resistance element layer; and
a first conductive layer and a second conductive layer adjacent to each other and spaced apart from each other and electrically non-conductive to each other via the insulation layer below or above the first resistance element layer,
wherein the first conductive layer is biased by a potential having a prescribed potential difference from a potential of the first electrode, and the second conductive layer is biased by a potential having a prescribed potential difference from a potential of the second electrode,
the feedback resistance element comprising:
a second resistance element layer embedded within the insulation layer on the semiconductor substrate;
a third electrode connected to one end of the second resistance element layer;
a fourth electrode connected to the other end of the second resistance element layer; and
a third conductive layer and a fourth conductive layer adjacent to each other and spaced apart from each other via the insulation layer below or above the second resistance element layer,
wherein the third conductive layer is biased by a potential of the third electrode, and the fourth conductive layer is biased by a potential of the fourth electrode, wherein the first conductive layer is biased by a potential having a prescribed potential difference from a potential of the third electrode, and the second conductive layer is biased by a potential having a prescribed potential difference from a potential of the fourth electrode, the amplifier comprising:
- a non-inverting input terminal;
- an inverting input terminal connected to the second electrode and the third electrode; and
- an output input terminal connected to the fourth electrode.

* * * * *